United States Patent
Schneider et al.

(10) Patent No.: US 7,439,892 B1
(45) Date of Patent: Oct. 21, 2008

(54) VARIABLE VOLTAGE GENERATOR FOR DELTA-SIGMA MODULATORS

(75) Inventors: Edmund M. Schneider, Austin, TX (US); John J. Paulos, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/771,930

(22) Filed: Jun. 29, 2007

(51) Int. Cl.
*H03M 3/00* (2006.01)

(52) U.S. Cl. ................................. 341/143; 341/172
(58) Field of Classification Search .......... 341/143–172
See application file for complete search history.

(56) References Cited

U.S. PATENT DOCUMENTS

| 5,659,586 A * | 8/1997 | Chun .......................... 375/355 |
| 6,366,230 B1 * | 4/2002 | Zhang et al. ................ 341/162 |
| 7,274,231 B1 * | 9/2007 | Gillespie et al. ............ 327/158 |
| 7,321,324 B2 * | 1/2008 | Piovaccari ................... 341/143 |

OTHER PUBLICATIONS

B. Del Signore & S. Harris, "Voltage References for SAR-Type A/D Converters"; Crystal Semiconductor Corporation, Austin, TX; 1996; 12 pages.
J. Wu; "Input Currents for High-Resolution ADCS"; Texas Instruments, Application Report; SBAA090-Apr. 2003; 9 pages.

* cited by examiner

*Primary Examiner*—Lam T Mai
(74) *Attorney, Agent, or Firm*—Dillon & Yudell LLP

(57) ABSTRACT

A modulator integrator circuit includes an amplifier having a capacitive feedback connection, a variable voltage generator, a fixed voltage reference, and a capacitor having a first plate and a second plate. The first plate of the capacitor is coupled to the variable voltage generator. The modulator reference circuit further includes a first switch that selectively couples the second plate of the capacitor to the amplifier and a second switch that selectively couples the second plate of the capacitor to the fixed voltage reference.

24 Claims, 4 Drawing Sheets

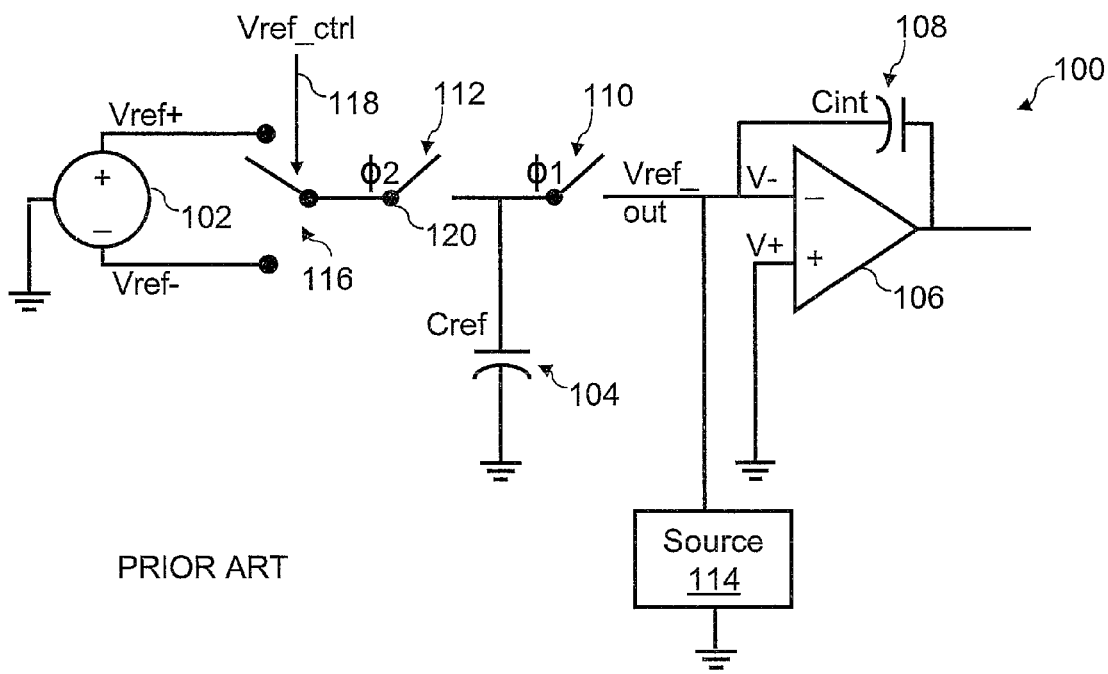
PRIOR ART
*Figure 1A*
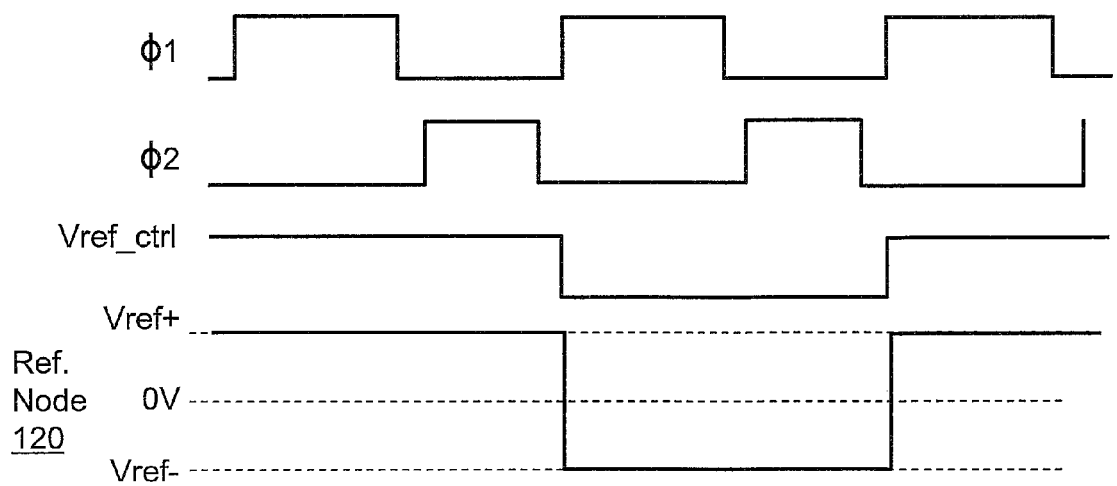
PRIOR ART     *Figure 1B*

VARIABLE VOLTAGE GENERATOR FOR DELTA-SIGMA MODULATORS

BACKGROUND OF THE INVENTION

1. Technical Field

The present invention relates in general to electrical circuits and more particularly, to a modulator reference circuit having a variable voltage generator.

2. Description of the Related Art

Many signal processing systems, such as audio processing systems, utilize delta-sigma modulators (also referred to as sigma-delta modulators) to provide output data with high, in-band signal to noise ratio. Analog-to-digital conversion delta-sigma modulators conventionally include, among other components, one or more integrators built with operational amplifiers (op-amps), capacitors, switches and voltage references. As is well-known to those skilled in the art, op-amp integrators typically employ a constant DC voltage reference, which is sampled and fed into at least the first integrator.

FIG. 1A depicts a conventional single-ended integrator circuit 100 for a delta-sigma modulator. As shown, integrator circuit 100 includes a voltage generator 102 that generates constant positive and negative reference voltages Vref+ and Vref−, which are typically of equal magnitude. Integrator circuit 100 further includes a reference capacitor (Cref) 104, and an op-amp 106 having a grounded positive input and a capacitor (Cint) 108 in its negative feedback loop. The top plate of Cref 104 is selectively coupled to the negative input of op-amp 106 by a first switch 110 that is closed when timing signal φ1 is asserted, and is further selectively coupled to reference node 120 by a second switch 112 that is closed when timing signal φ2 is asserted. A third switch 116, which is controlled by Vref_ctrl signal 118, selects the polarity of the reference voltage applied to reference node 120.

The input signal provided to the delta-sigma modulator by source 114, which is coupled to the negative input of op-amp 106, can either be a current or a voltage. Often when the input signal is a voltage, the voltage is periodically sampled through an input sampling network similar to the reference sampling network comprising switches 110, 112 and capacitor 104.

FIG. 1B is a timing diagram depicting the DC reference voltage supplied by voltage generator 102 through switch 116 to reference node 120 in relation to timing signals φ1 and φ2 and Vref_ctrl signal 118. In operation, when timing signal φ1 is deasserted and timing signal φ2 is asserted, first switch 110 opens and second switch 112 closes, causing the reference voltage selected by Vref_ctrl signal 118 for application to reference node 120 (i.e., either Vref+ or Vref−) to be sampled onto Cref 104. Subsequently, when timing signal φ1 is asserted and timing signal φ2 is deasserted, the charge Q stored by Cref 104, which is given by Q=Cref×Vref, is transferred from Cref 104 to Cint 108. At the end of the assertion of timing signal φ1, Cref 104 is almost if not completely discharged, and the voltage on its top plate is approximately 0V. Consequently, when second switch 112 closes in response to assertion of φ2, second switch 112 has a positive or negative voltage across its terminals equal in magnitude to Vref.

SUMMARY OF THE INVENTION

The present invention provides improved apparatus, systems and methods for signal processing in which a variable voltage generator is employed in a modulator reference circuit to reduce voltage stress on circuit switches.

According to one embodiment, a modulator circuit includes a variable voltage generator, a fixed voltage reference, and a capacitor having first and second plates. The first plate of the capacitor is coupled to the variable voltage generator. The modulator circuit further includes a first switch that selectively couples the second plate of the capacitor to an integrator of the modulator loop filter and a second switch that selectively couples the second plate of the capacitor to the fixed voltage reference.

According to another embodiment, a method of modulator stress relief includes periodically varying a voltage of a variable voltage reference generator of a delta-sigma modulator. A capacitor is charged by the variable voltage reference generator. Switches are periodically activated to alternately couple the capacitor to a variable voltage reference generator and to the virtual ground of an amplifier of the delta-sigma modulator, such that switching voltage stress is reduced.

In yet another embodiment, a delta-sigma modulation system comprises one or more integrators. A first integrator among the one or more integrators has a summing input node that is coupled to receive an input signal and a reference voltage from a modulator reference circuit having a variable voltage generator. A quantizer is coupled to the output of the one or more integrators. The output of the quantizer is fed back to control the modulator reference circuit.

All objects, features, and advantages of the present invention will be come apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

FIG. 1A is a circuit schematic of an integrator and a modulator reference circuit in accordance with the prior art;

FIG. 1B is a timing diagram illustrating a DC reference voltage (Vref) with reference to timing signals φ1 and φ2 utilized to control the switches of the prior art circuit depicted in FIG. 1A;

DETAILED DESCRIPTION OF ILLUSTRATIVE EMBODIMENT

In conventional modulator reference circuits, such as that described above with reference to FIG. 1, the constant DC reference voltage of the voltage generator is placed across the terminals of a switch (e.g., second switch 112) during operation of the circuit. Specifically, prior to, and immediately after switch 112 closes, switch 112 sees the full voltage Vref+ or Vref− across its terminals because Cref 104 is assumed discharged to ground. If the magnitude of Vref is too high, the gate-to-drain and gate-to-source voltage (Vg) across the terminals of the switch transistor can exceed the maximum safe operating voltage of the fabrication technology and cause a breakdown of the gate oxide. Consequently, the maximum reference voltage that can be tolerated in conventional modulator reference circuits is limited by the maximum drain-to-source terminal voltage (Vds) that can be safely applied to the switch transistor, or more likely, the minimum gate voltage (Vg) required to fully turn on and off the switch transistor to accommodate the constant reference voltage.

The present invention appreciates that the limitation of the reference voltage by the characteristics of a switch transistor is undesirable because the signal to noise ratio (SNR) achieved by a delta-sigma modulator is directly proportional to the reference voltage. Because of the direct beneficial effect increasing the reference voltage has on the SNR for both single-bit and multi-bit delta-sigma modulators, the present invention recognizes that it would be desirable to be able to increase the reference voltage of switched modulator reference circuits without over-stressing switch transistors.

Figure 2:
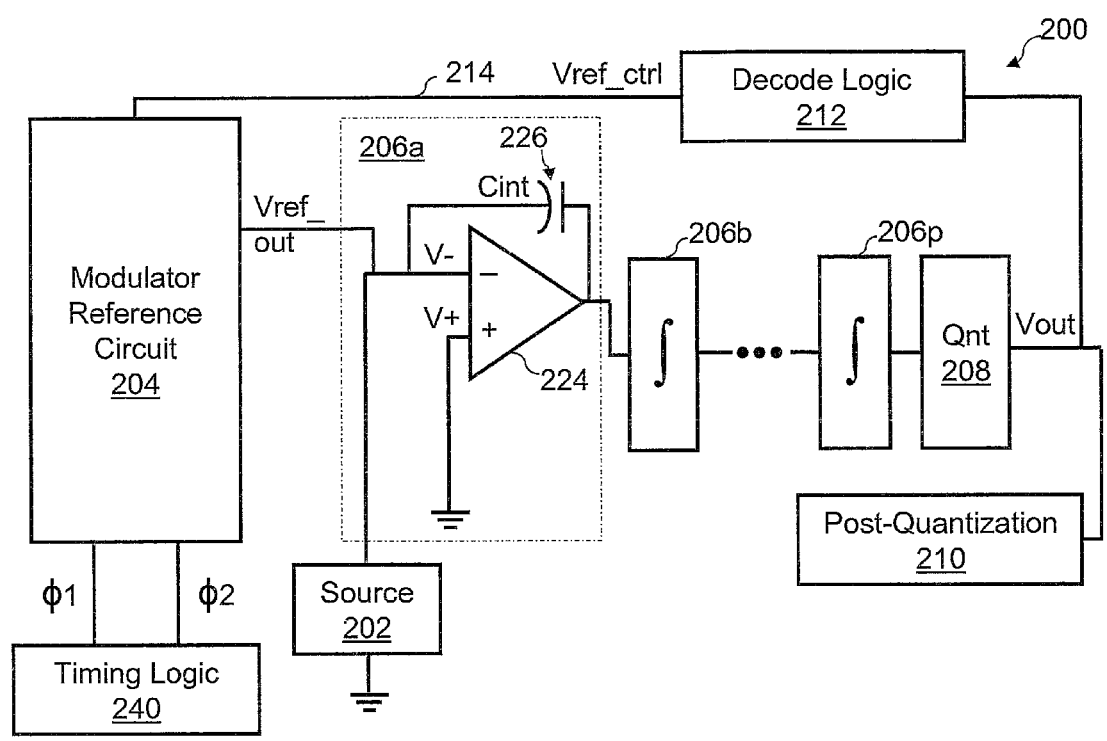
FIG. 2 illustrates an exemplary embodiment of a signal processing system including a modulator reference circuit in accordance with the present invention.

With reference now to FIG. 2, there is illustrated an exemplary signal processing system 200 including a delta-sigma modulator circuit having a variable switched voltage generator in accordance with the present invention. In a preferred embodiment, signal processing system 200 is implemented at least partially with integrated circuitry, utilizing conventional or future developed fabrication techniques.

As depicted, signal processing system 200 includes a signal source 202 that provides either an analog current or a capacitively sampled analog voltage as an input signal. Signal processing system 200 further includes a P-order loop filter comprising P integrator(s) 206a-206p coupled in series, where P is an integer greater than or equal to 1. In the depicted embodiment, first integrator 206a includes an op-amp 224 having a grounded positive input and a capacitor (Cint) 226 in a feedback loop coupling its output and negative input. The input signal provided by signal source 202 and a reference voltage (Vref_out) provided by modulator reference circuit 204 are summed at the negative input of first integrator 206a. A quantizer 208 quantizes the output of the P-order loop filter comprising integrator(s) 206a-206p to obtain a 1-bit digital output signal having an output voltage Vout. Post-quantization component(s) 210 receive the output signal of quantizer 208 and perform subsequent processing and/or data handling. In one exemplary embodiment, post-quantization component(s) 210 encode a digital recording media using the output signal of quantizer 208 and/or present the output signal within a display. Of course, in other embodiments, post-quantization component(s) 210 may perform other implementation-dependent data processing and/or data handling functions.

Signal processing system 200 further includes decode logic 212 and timing logic 240. Decode logic 212, which is also coupled to quantizer 208, decodes the output signal of quantizer 208 and generates a Vref_ctrl signal 214 that is provided to modulator reference circuit 204. Timing logic 240 generates timing signals φ1 and φ2, which are utilized to time the operation of modulator reference circuit 204, as described below with reference to FIGS. 3B and 4B.

Figure 3A:
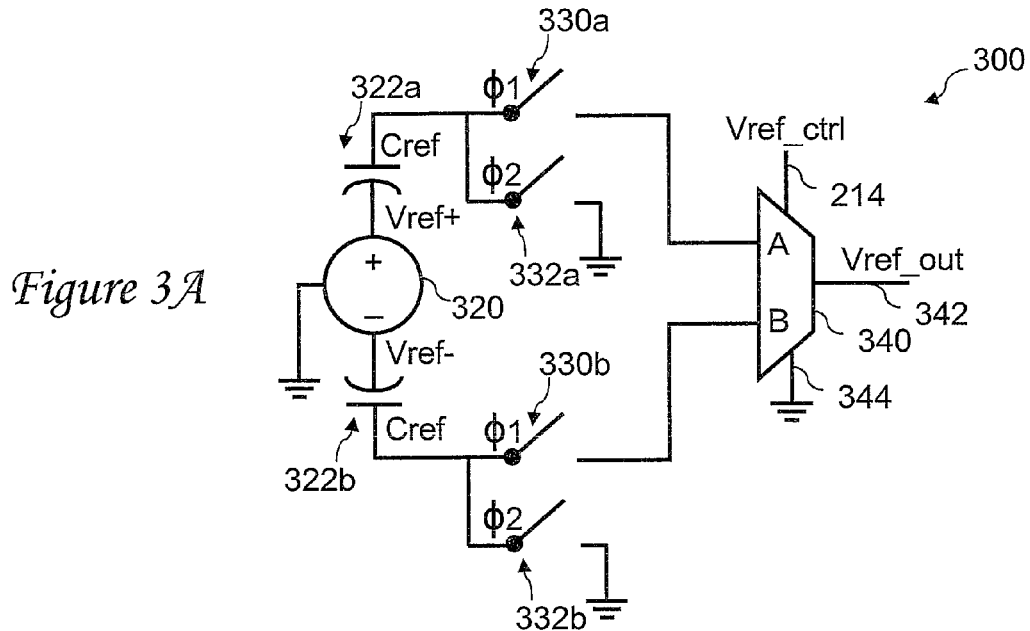
FIG. 3A depicts a first exemplary embodiment of the modulator reference circuit of FIG. 2 in accordance with the present invention.

Referring now to FIG. 3A, there is depicted a first embodiment of a modulator reference circuit 300 that may be used to implement modulator reference circuit 204 of FIG. 2. As shown, modulator reference circuit 300 includes a variable voltage generator 320 that generates a positive variable reference voltage (Vref+) and a negative variable reference voltage (Vref−), which preferably but not necessarily have maximum voltages Vref+_max and Vref−_max of equal magnitude. In various embodiments, variable voltage generator 320 can either be external to or integrated within the substrate in which some or all of the remainder of signal processing system 200 is formed.

Coupled to each of the positive and negative terminals of variable voltage generator 320 is a respective reference capacitor (Cref) 322a, 322b. Reference capacitor Cref 322a has first plate coupled to receive Vref+ and a second plate characterized by a voltage Vtop+. Similarly, reference capacitor Cref 322b has first plate coupled to receive Vref− and a second plate characterized by a voltage Vtop−.

The second plate of each of reference capacitors Cref 322a and Cref 322b is coupled to a respective pair of first and second switches 330, 332. As shown, each first switch 330a, 330b, which is closed when timing signal φ1 is asserted, selectively couples the second plate of its respective reference capacitor Cref 322 to one of the inputs (i.e., A or B) of multiplexer 340. Each second switch 332a, 332b, which is closed when timing signal φ2 is asserted, selectively couples the second plate of its respective reference capacitor Cref 322 to a fixed voltage reference (in this case, ground). All four switches 330a, 330b, 332a and 332b can be implemented, for example, as Metal-Oxide-Semiconductor (MOS) transistors, which are potentially subject to voltage stress and a breakdown of the gate oxide if the gate voltage (Vg) of the switch transistor exceeds an implementation-dependent threshold.

Multiplexer 340 selects an input voltage of one of inputs A and B as its output voltage (Vref_out) in response to Vref_ctrl signal 214. As indicated in FIG. 2, output voltage Vref_out is applied to the summing node of first integrator 206a of signal processing system 200. Multiplexer 340 applies the voltage of the non-selected input to a reference terminal 344 that mimics the virtual ground of Vref_out. As indicated, in some embodiments, reference terminal 344 can simply be a ground terminal. In a fully differential embodiment, reference terminal 344 can be implemented as the virtual ground provided by the summing node of the other input of a differential amplifier.

The operation of multiplexer 340 is to transfer charge to the summing node of integrator 206a under the control of Vref_ctrl signal 214. If input A is selected, representing the positive variable reference voltage, a net charge of Q=Cref+×ΔV=Cref+×(Vref+_max−0V)=Cref+×Vref+_max is transferred from voltage generator 320 to the summing node during the assertion of timing signal φ1. Similarly, if input B is selected, representing the negative variable reference voltage, a net charge of Q=Cref−ΔVref−_max is transferred from voltage generator 320 to the summing node during the assertion of timing signal 11.

Figure 3B:
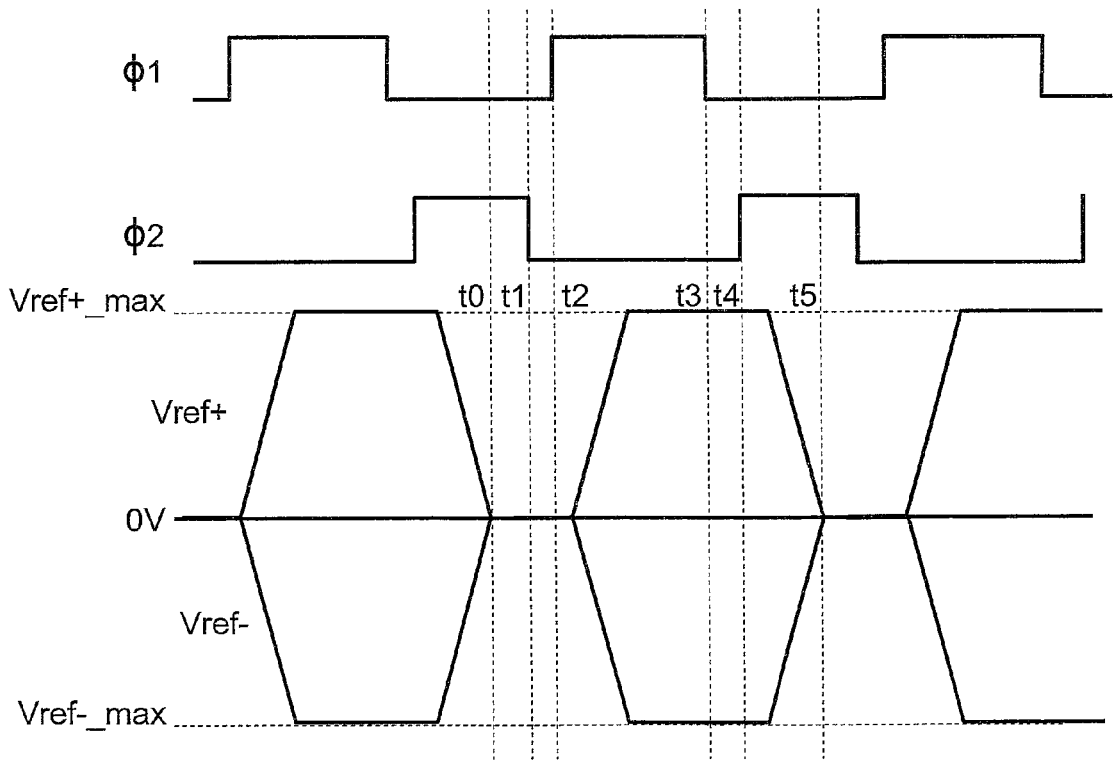
FIG. 3B is a timing diagram of the variable DC reference voltages Vref+ and Vref− of the modulator reference circuit depicted in FIG. 3A with reference to timing signals φ1 and φ2 utilized to control the switches of the modulator reference circuit.

FIG. 3B is a timing diagram depicting the variable reference voltages Vref+ and Vref− supplied by modulator reference circuit 300 with reference to the timing signals φ1 and φ2 that control switches 330a, 330b, 332a and 332b. As shown, timing signals φ1 and φ2 have cycles of fixed duration and opposite phase. Thus, timing signal φ1 is asserted while timing signal φ2 is deasserted, and timing signal φ1 is asserted while timing signal φ2 is deasserted.

FIG. 3B further illustrates that variable voltage generator 320 ramps the positive variable reference voltage Vref+ from 0V to a maximum positive reference voltage (Vref+max) after timing signal φ1 is asserted and ramps the reference voltage from Vref+_max to 0V after timing signal φ2 is asserted. Similarly, variable voltage generator 320 ramps the negative variable reference voltage Vref− from 0V to a maximum negative reference voltage (Vref− max) after timing signal φ1 is asserted and ramps the reference voltage from Vref−_max to 0V after timing signal φ2 is asserted. The upward and downward slopes of the Vref+ and Vref− voltage ramps are preferably limited so that the rate of voltage change is less than the slew rate of op-amp 224.

An exemplary cycle of operation of modulator reference circuit 300 will now be described, assuming as initial conditions at time t0 that timing signal φ2 is asserted, the variable reference voltages of Vref+ and Vref− are at 0V, and second switches 332a, 332b are closed to connect the second plate of each of Cref 322a, 332b to ground. With these initial conditions, the second plates of reference capacitors Cref 322a, 322b are shorted to ground, causing each of reference capacitors Cref 322a, 322b to be discharged with the second plates of reference capacitors Cref 322a, 322b at 0V. Next, at time t1, timing signal φ2 is deasserted, causing second switches 332a, 332b to open. With second switches 332a, 332b open, voltages Vtop+ and Vtop− initially remain unchanged at 0V.

Next, at time t2, timing signal φ1 is asserted, causing first switches 330a, 330b to close, connecting the second plate of Cref 322a to input A of multiplexer 340 and connecting the second plate of Cref 322b to input B of multiplexer 340. In response to Vref_ctrl signal 214, multiplexer 340 connects one of inputs A and B to the virtual ground of op-amp 224 and the other of inputs A and B to reference terminal 344. Thus, voltages Vtop+ and Vtop− both remain at approximately 0V. As before, the ramping of voltages Vref+ and Vref− while tiling signal φ1 is asserted does not affect the virtual ground of op-amp 224, meaning that the Vtop+ and Vtop− voltages remain at approximately 0V even when Vref+_max and Vref−_max are reached.

When timing signal φ1 is deasserted at time t3, first switches 330a, 330b open, and Vtop+ and Vtop− remain unchanged due to the connection through multiplexer 340 to reference terminal 344 or to the virtual ground of op-amp 224. Voltages Vtop+ and Vtop− thereafter return to ground when timing signal φ2 is asserted at time t4 and second switches 332a, 332b close, again connecting the second plates of Cref 322a and Cref 322b to ground. The exemplary cycle of operation thereafter concludes with the reference voltages Vref+ and Vref− ramping back to 0V at time t5.

It should be noted that during the entire cycle of operation, voltages Vtop+ and Vtop− never deviate from 0V (i.e., ground) by more than the virtual ground of op-amp 224. As a result, neither first switches 330 nor second switches 332 have any appreciable voltage at their drain or source terminals at any point in the operation of modulator reference circuit 300, so that over-stress of switches 330, 332 is avoided. Consequently, switches 330, 332 can be quite small and can be made to approach the selected technology's minimum transistor size, while permitting voltages Vref+_max, Vref−_max and the SNR to be appreciably increased as compared to prior art designs.

Figure 4A:
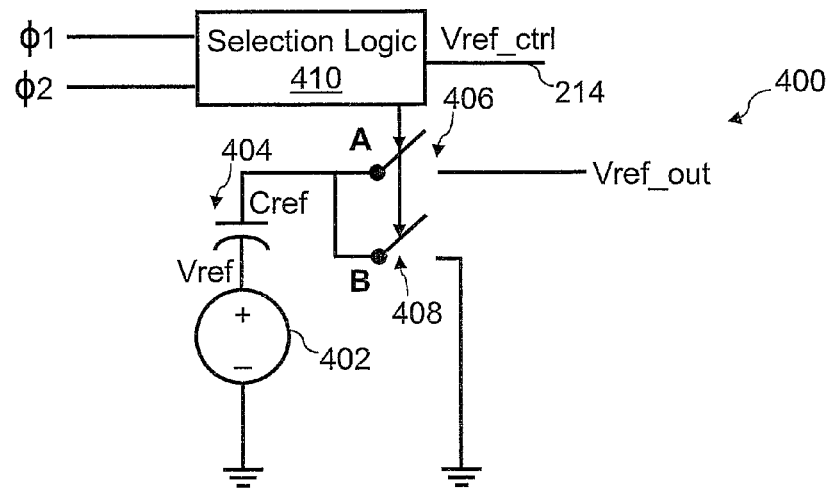
FIG. 4A depicts a second exemplary embodiment of the modulator reference circuit of FIG. 2 in accordance with the present invention.

With reference now to FIG. 4A, there is illustrated a second exemplary embodiment of a modulator reference circuit 400 that can be utilized to implement modulator reference circuit 204 of FIG. 2 in accordance with the present invention. As shown, modulator reference circuit 400 of FIG. 4A includes a variable voltage generator 402 that generates a single variable reference voltage (Vref) that varies between 0V and a maximum reference voltage Vref_max. As with voltage generator 320 of FIG. 3A, variable voltage generator 402 can either be external to or integrated within the substrate in which some or all of the remainder of signal processing system 200 is formed.

Modulator reference circuit 400 also includes a reference capacitor (Cref) 404 having a first plate coupled to variable voltage generator 402 and a second plate characterized by a voltage Vtop. The second plate of reference capacitor Cref 404 is selectively coupled by a first switch 406 to the summing node of op-amp 224 to provide the reference voltage Vref_out and is selectively coupled by a second switch 408 to a fixed voltage reference, which in the depicted embodiment is ground. First switch 406 and second switch 408 are respectively controlled by control signals A and B. Selection logic 410 selects one of timing signals φ1 and φ2 as control signal A and the other of timing signals φ1 and φ2 as control signal B in response to Vref_ctrl signal 214.

As with first and second switches 330, 332 described above, first switch 406 and second switch 408 of FIG. 4A can each be implemented, for example, with Metal-Oxide-Semiconductor (MOS) transistors. As such, switches 406, 408 are potentially subject to voltage stress and a breakdown of the gate oxide if the gate voltage (Vg) of the switch transistor exceeds an implementation-dependent threshold.

Figure 4B:
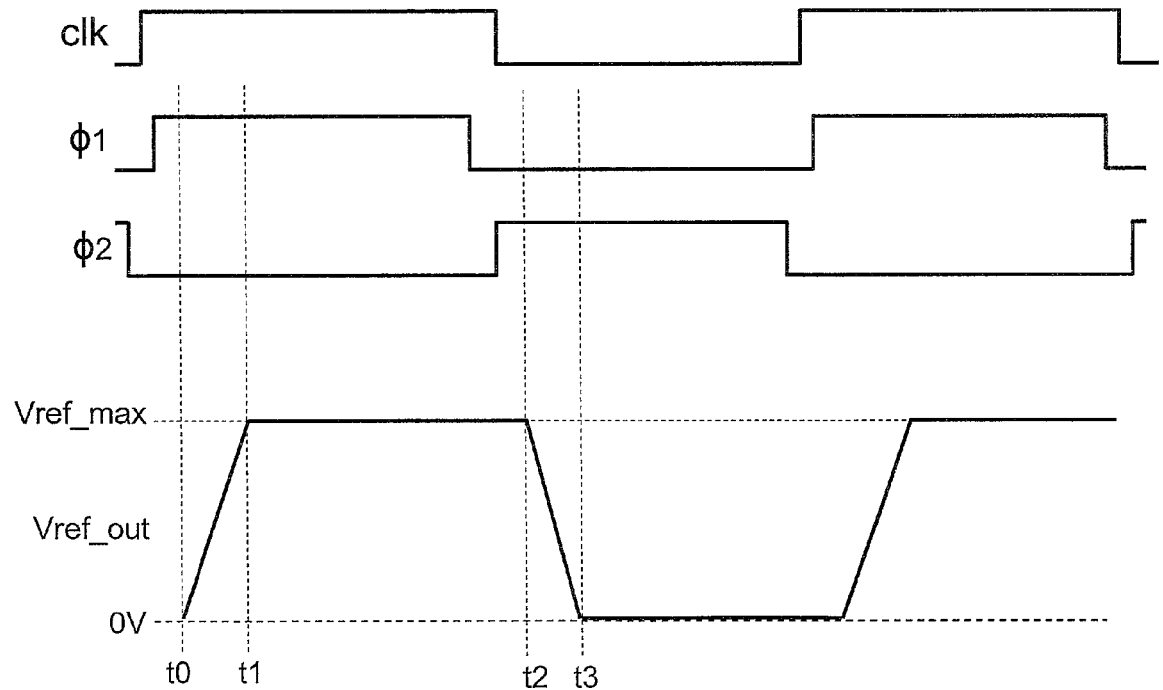
FIG. 4B is a timing diagram of the variable DC reference voltage Vref of the modulator reference circuit depicted in FIG. 4A with reference to switching timing signals φ and φ2.

Referring now to FIG. 4B, a timing diagram of the variable reference voltage Vref supplied by variable voltage generator 402 is depicted with reference to the timing signals φ1 and φ2. As shown, timing signals φ1 and φ2 have cycles of fixed duration and opposite phase. Thus, timing signal φ1 is asserted while timing signal φ2 is deasserted, and timing signal φ2 is asserted while timing signal φ1 is deasserted. In the depicted embodiment, variable voltage generator 402 ramps voltage Vref from 0V to Vref_max during the interval between times t0 and t1 and ramps voltage Vref from Vref−_max to 0V during the interval between times t2 and t3. As previously discussed, the rate of voltage change by variable voltage generator 402 is preferably less than the slew rate of op-amp 224.

If control signal A is asserted to close first switch 406 between times t0 and t1, a net charge Q, which is given by Q=Cref×ΔV=Cref×(Vref_max−0V)=Cref×Vref_max, is injected into the summing node of op-amp 224. Likewise, if control signal A is asserted to close first switch 406 in the interval between times t2 and t3, a net charge Q, which is given by Q=Cref×ΔV=Cref×(0V−Vref_max)=−Cref×Vref−_max, is transferred from variable voltage generator 402 to the summing node of op-amp 224.

Thus, if selection logic 410 selects timing signal φ1 as control signal A of first switch 406 and selects timing signal φ2 as control signal B of second switch 408, then the summing node of op-amp 224 is connected to variable voltage generator 402 through reference capacitor Cref 404 during the assertion of timing signal φ1. Because the interval between times t0 and t1 occurs when timing signal φ1 is asserted, a net charge of Q=C_ref×Vref_max is transferred from variable voltage generator 402 to the summing node of op-amp 224 while timing signal φ1 is asserted. Because there is no connection from variable voltage generator 402 to the summing node of op-amp 224 while timing signal φ2 is asserted, no charge is transferred from variable voltage reference 402 to the summing node of op-amp 224 while timing signal φ2 is asserted.

Alternatively, if selection logic 410 selects timing signal φ2 as control signal A of first switch 406 and selects timing signal φ1 as control signal B of second switch 408, then the summing node of op-amp 224 is connected to variable voltage generator 402 through reference capacitor Cref 404 while timing signal φ2 is asserted. Because the interval between times t2 and t3 occurs while timing signal φ2 is asserted, a net charge of Q=−C_ref×Vref_max is transferred from variable voltage generator 402 to the summing node of op-amp 224 while timing signal φ2 is asserted. Because there is no connection from variable voltage generator 402 to the summing node of op-amp 224 while timing signal φ1 is asserted, no charge is transferred from variable voltage reference 402 to the summing node of op-amp 224 while timing signal φ1 is asserted.

As can be seen, positive net charge or negative net charge can be transferred from the variable voltage generator 402 to op-amp 224 even if only a single reference voltage is generated. Vref_ctrl signal 214 can be used to control how first switch 406 and second switch 408 are connected to timing signals φ1 and φ2 so that, over a given clock cycle, a charge of either Q=C_ref×Vref_max or Q=−C_ref×Vref_max is delivered to op-amp 224.

It should again be noted that during the entire cycle of operation, the voltage Vtop of the second plate of Cref 404, never deviates from 0V (i.e., ground) by more than the virtual ground of op-amp 224. As a result, neither first switch 406 nor second switch 408 has any appreciable voltage at its drain or source terminal at any point in the operation of modulator reference circuit 204, so that over-stress of switches 406, 408 is avoided. Consequently, as with the previously discussed embodiment, switches 406, 408 can be quite small and can be made to approach the selected technology's minimum transistor size.

As has been described, the present invention provides improved apparatus, systems and methods for signal processing in which a variable voltage generator is employed in a modulator reference circuit to relieve voltage stress on circuit switches.

While the invention has been particularly shown and described with reference to a preferred embodiment, it will be understood by those skilled in the art that various changes in form and detail may be made therein without departing from the spirit and scope of the invention. For example, while the present invention has been primarily described with reference to a delta-sigma modulator having a single-ended integrator circuit, those skilled in the art will appreciate that the present invention is equally applicable to and includes embodiments employing a fully differential integrator circuit. Although numerous differential embodiments are possible, one embodiment employing a differential integrator circuit can be constructed by replacing first integrator 206a of FIG. 2 with a differential integrator and by employing a modulator reference circuit 300 as shown in FIG. 3A with its reference terminal 344 coupled to the positive input of the differential integrator.

In addition, it should be understood that while the present invention has been described with reference to embodiments of a single bit delta-sigma modulator, the present invention is also applicable to multi-bit delta-sigma modulators (whether differential or single-ended). While many embodiments of multi-bit delta-sigma modulators are possible, one exemplary embodiment of a multi-bit delta-sigma modulator alters quantizer 208, decode logic 212, and Vref_ctrl signal 214 of signal processing system 200 to handle multi-bit signals. In addition, N instances of modulator reference circuit 400 of FIG. 4A (where N is an integer equal to the number of bits) are implemented in lieu of modulator reference circuit 204, with each bit of the multi-bit Vref_ctrl signal 214 coupled to a respective one of the N modulator reference circuits 400. Practical embodiments of signal processing systems employing multi-bit delta-sigma modulators may include additional system modifications such as element matching or other circuitry deemed beneficial by those skilled in the art.

It will further be appreciated that alternative embodiments falling within the scope of the present invention may replace first and second switches 406, 408 or first and second switches 330, 332 and multiplexer 340 with functionally or logically equivalent circuitry that constrain Vtop (or Vtop+/Vtop−) at ground or virtual ground while Vref (or Vref+ and Vref−) is/are ramping.

What is claimed is:

1. A modulator integrator circuit comprising:
   an amplifier having a capacitive feedback connection;
   a variable voltage generator that generates at least one periodically variable reference voltage;
   a fixed voltage reference;
   a capacitor having a first plate and a second plate, wherein the first plate is coupled to receive the variable reference voltage;
   a first switch that selectively couples the second plate of the capacitor to the amplifier; and
   a second switch that selectively couples the second plate of the capacitor to the fixed voltage reference.

2. The modulator integrator circuit of claim 1, wherein the fixed voltage reference is a ground reference.

3. The modulator integrator circuit of claim 1, wherein:
   the amplifier includes a negative input and a positive input;
   the first switch selectively couples the second plate of the capacitor to the negative input of the amplifier; and
   the positive input is coupled to the fixed voltage reference.

4. The modulator integrator circuit of claim 1, wherein the first switch and the second switch alternately and periodically couple the second plate of the capacitor to the amplifier and to the fixed voltage reference.

5. The modulator integrator circuit of claim 1, wherein a reference voltage of the variable voltage reference varies periodically between a voltage of the fixed voltage reference and a maximum reference voltage.

6. The modulator integrator circuit of claim 1, wherein the amplifier has an input having a virtual ground voltage and a voltage of the second plate of the capacitor varies between the virtual ground voltage and a voltage of the fixed voltage reference.

7. The modulator integrator circuit of claim 1, wherein:
   said variable voltage generator generates a positive variable reference voltage and a negative variable reference voltage;
   the capacitor is a first capacitor coupled to receive the positive variable reference voltage and the modulator integrator circuit further includes a second capacitor coupled to receive the negative variable reference voltage;
   another first switch that selectively couples the second capacitor to the amplifier; and
   another second switch that selectively couples the second capacitor to the fixed voltage reference; and
   a multiplexer interposed between the first switch and said another first switch and the amplifier, wherein said multiplexer selects an output reference voltage to be applied to the amplifier.

8. A signal processing system, comprising:
   a loop filter including a modulator integrator circuit in accordance with claim 1, wherein said amplifier is coupled to receive an input signal; and
   a quantizer coupled to the loop filter.

9. A method of modulator stress relief, comprising:
   periodically varying a reference voltage of a variable voltage generator of a delta-sigma modulator, the delta-sigma modulator including an amplifier having a virtual ground;
   charging a capacitor with the variable voltage reference; and periodically activating switches to alternately couple the capacitor to a fixed voltage reference and to the virtual ground of the amplifier, such that switching voltage stress is reduced.

10. The method of claim 9, wherein the fixed voltage reference is a ground reference.

11. The method of claim 9, wherein:
the amplifier includes a negative input and a positive input;
periodically activating switches includes periodically activating a switch to couple the capacitor to the negative input of the amplifier.

12. The method of claim 9, wherein periodically varying the reference voltage of the variable voltage reference includes periodically varying the voltage of the variable voltage reference between the fixed voltage reference and a maximum reference voltage.

13. The method of claim 9, wherein:
the amplifier has an input having a virtual ground voltage; and
the method further comprises limiting a voltage across said switches to the virtual ground voltage.

14. A delta-sigma modulation system comprising:
a modulator reference circuit having a switched, periodically variable voltage generator that generates at least one variable reference voltage;
a loop filter coupled to the output of the modulator reference circuit and having a filter output; and
a quantizer, coupled to the filter output, that outputs an output signal.

15. The delta-sigma modulation system of claim 14, wherein:
the loop filter comprises an amplifier having a capacitive negative feedback connection and a negative input coupled to the modulator reference circuit;
the modulator reference circuit includes:
a fixed voltage reference;
the variable voltage generator, wherein the variable voltage generator periodically varies the at least one reference voltage between a voltage of the fixed voltage reference and a maximum reference voltage;
a reference capacitor having a first plate and a second plate, wherein the first plate is coupled to the variable voltage generator; and
switches that selectively and periodically couples the second plate of the reference capacitor to the negative input of the amplifier and to the fixed voltage reference.

16. The delta-sigma modulation system of claim 15, wherein the fixed voltage reference is a ground reference.

17. The delta-sigma modulation system of claim 15, wherein the amplifier includes a positive input coupled to the fixed voltage reference.

18. The delta-sigma modulation system of claim 15, wherein a voltage of the variable voltage generator varies periodically between a voltage of the fixed voltage reference and a maximum reference voltage.

19. The delta-sigma modulation system of claim 15, wherein the loop filter includes an amplifier having an input characterized by a virtual ground voltage and a voltage of second plate of the capacitor varies between the virtual ground voltage and a voltage of the fixed voltage reference.

20. The delta-sigma modulation system of claim 15, wherein:
said variable voltage generator generates a positive variable reference voltage and a negative variable reference voltage;
the reference capacitor is a first reference capacitor coupled to receive the positive variable reference voltage and the modulator integrator circuit further includes a second reference capacitor coupled to receive the negative variable reference voltage;
another first switch that selectively couples the second capacitor to the amplifier;
another second switch that selectively couples the second capacitor to the fixed voltage reference; and
a multiplexer interposed between the first switch and said another first switch and the amplifier, wherein said multiplexer selects an output reference voltage to be applied to the amplifier.

21. A signal processing system comprising:
a delta-sigma modulation system in accordance with claim 14; and
post-quantization processing logic coupled to receive the output signal of the quantizer.

22. The signal processing system of claim 21, further comprising an input source coupled to the modulator integrator circuit.

23. The signal processing system of claim 22, wherein the input source comprises a continuous time input current source.

24. A modulator integrator circuit comprising:
an amplifier having a capacitive negative feedback connection;
a fixed voltage reference;
a variable voltage generator that periodically varies a positive variable reference voltage between a voltage of the fixed voltage reference and a positive maximum reference voltage and that periodically varies a negative variable reference voltage between a voltage of the fixed voltage reference and a negative maximum reference voltage;
a first reference capacitor coupled to receive the positive variable reference voltage;
a second reference capacitor coupled to receive the negative variable reference voltage; and
switching that alternately and periodically couples the amplifier to receive a positive output reference voltage from the first reference capacitor and couples the amplifier to receive a negative output reference voltage from the second reference capacitor.

* * * * *